(12) United States Patent
Xia

(10) Patent No.: US 11,283,032 B2
(45) Date of Patent: Mar. 22, 2022

(54) FLEXIBLE SUBSTRATE, FLEXIBLE DISPLAY PANEL, AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Chen Xia, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 478 days.

(21) Appl. No.: 16/472,974

(22) PCT Filed: Mar. 19, 2019

(86) PCT No.: PCT/CN2019/078750
§ 371 (c)(1),
(2) Date: Jun. 24, 2019

(87) PCT Pub. No.: WO2020/118953
PCT Pub. Date: Jun. 18, 2020

(65) Prior Publication Data
US 2021/0359232 A1    Nov. 18, 2021

(30) Foreign Application Priority Data

Dec. 15, 2018 (CN) .......................... 201811537513.0

(51) Int. Cl.
*H01L 51/00* (2006.01)
*H01L 27/32* (2006.01)
*H01L 51/56* (2006.01)
*B32B 27/28* (2006.01)
*B32B 7/12* (2006.01)
*B32B 27/08* (2006.01)
(Continued)

(52) U.S. Cl.
CPC ............ *H01L 51/0097* (2013.01); *B32B 3/28* (2013.01); *B32B 3/30* (2013.01); *B32B 7/022* (2019.01);
(Continued)

(58) Field of Classification Search
CPC .......... H01L 27/3244; H01L 2227/326; H01L 51/0097; H01L 51/003; H01L 2251/5338;
(Continued)

(56) References Cited

U.S. PATENT DOCUMENTS 9,429,999 B2* 8/2016 Lee ........................ G06F 1/1652
9,645,613 B2* 5/2017 Nam ..................... G06F 1/1652
(Continued)

FOREIGN PATENT DOCUMENTS

CN   105679800 A   6/2016
CN   106847858 A   6/2017
(Continued)

*Primary Examiner* — Victoria K. Hall

(57) ABSTRACT

A flexible substrate, a flexible display panel, and a manufacturing method are provided. The method of manufacturing the flexible display panel includes forming a first organic layer on a substrate; determining a bending area on the first organic layer and forming an adhesion layer on a part of the first organic layer, located in the bending area; forming an inorganic layer on the adhesion layer and on the first organic layer; forming a second organic layer on the inorganic layer; forming a thin-film transistor layer, an organic light-emitting diode layer, and an encapsulation layer on the second organic layer in sequence; removing the substrate; and removing the part of the first organic layer, located in the bending area, and the adhesion layer so that the flexible display panel is formed.

10 Claims, 4 Drawing Sheets

(51) Int. Cl.
*B32B 37/12* (2006.01)
*B32B 37/24* (2006.01)
*B32B 7/05* (2019.01)
*H05K 1/02* (2006.01)
*B32B 3/28* (2006.01)
*B32B 3/30* (2006.01)
*H05K 1/11* (2006.01)
*B32B 7/022* (2019.01)

(52) U.S. Cl.
CPC .............. *B32B 7/05* (2019.01); *B32B 7/12* (2013.01); *B32B 27/08* (2013.01); *B32B 27/281* (2013.01); *B32B 37/12* (2013.01); *B32B 37/24* (2013.01); *H01L 27/3244* (2013.01); *H01L 51/003* (2013.01); *H01L 51/56* (2013.01); *H05K 1/028* (2013.01); *H05K 1/118* (2013.01); *B32B 2037/243* (2013.01); *B32B 2255/10* (2013.01); *B32B 2255/20* (2013.01); *B32B 2457/20* (2013.01); *B32B 2457/206* (2013.01); *H01L 2227/326* (2013.01); *H01L 2251/5338* (2013.01); *H05K 2201/055* (2013.01); *H05K 2201/10128* (2013.01)

(58) Field of Classification Search
CPC . B32B 2457/20; B32B 2457/206; B32B 7/05; B32B 7/022; B32B 3/28; B32B 3/30; H05K 2201/10128; H05K 2201/055; H05K 1/028; H05K 1/118
See application file for complete search history.

(56) References Cited

U.S. PATENT DOCUMENTS

| | | | | |
|---|---|---|---|---|
| 9,773,853 B2* | 9/2017 | Tao | ..................... | H01L 27/3246 |
| 10,056,444 B2* | 8/2018 | Cho | ..................... | H01L 27/3276 |
| 10,141,540 B2* | 11/2018 | Sung | ..................... | H01L 51/56 |
| 10,295,818 B2* | 5/2019 | Nam | ..................... | B32B 27/08 |
| 10,545,537 B2* | 1/2020 | Ahn | ..................... | B32B 17/06 |
| 10,600,989 B1* | 3/2020 | Ai | ..................... | H01L 51/524 |
| 10,748,973 B2* | 8/2020 | Han | ..................... | G09G 3/3225 |
| 10,915,144 B2* | 2/2021 | Namkung | ..................... | G02F 1/133305 |
| 11,036,071 B2* | 6/2021 | Um | ..................... | H01L 27/1262 |
| 11,081,660 B2* | 8/2021 | Lee | ..................... | B32B 3/30 |
| 11,084,250 B2* | 8/2021 | Jung | ..................... | H01L 27/32 |
| 11,181,732 B2* | 11/2021 | Nam | ..................... | B32B 27/36 |
| 2015/0147532 A1* | 5/2015 | Nam | ..................... | B32B 3/30 428/172 |
| 2015/0268697 A1* | 9/2015 | Nam | ..................... | B32B 3/30 428/157 |
| 2017/0062742 A1 | 3/2017 | Kim | | |
| 2017/0117215 A1* | 4/2017 | Im | ..................... | H01L 23/49894 |
| 2017/0263887 A1* | 9/2017 | Han | ..................... | H01L 27/3244 |
| 2017/0323779 A1* | 11/2017 | Um | ..................... | H01L 27/1262 |
| 2018/0108862 A1 | 4/2018 | Wang | | |
| 2018/0175323 A1* | 6/2018 | Ahn | ..................... | H01L 51/56 |
| 2018/0364759 A1* | 12/2018 | Ahn | ..................... | G06F 1/1616 |
| 2019/0061318 A1* | 2/2019 | Jung | ..................... | G06F 3/041 |
| 2019/0157619 A1 | 5/2019 | Lee et al. | | |
| 2019/0237532 A1* | 8/2019 | Ahn | ..................... | G02F 1/133305 |
| 2019/0293921 A1* | 9/2019 | Nam | ..................... | B32B 3/30 |
| 2019/0341566 A1* | 11/2019 | Lee | ..................... | H01L 27/3276 |
| 2019/0364142 A1* | 11/2019 | Yuan | ..................... | H01L 51/0097 |
| 2020/0022267 A1* | 1/2020 | Han | ..................... | B32B 27/302 |
| 2021/0265578 A1* | 8/2021 | Lee | ..................... | H01L 51/0097 |
| 2021/0335900 A1* | 10/2021 | Ni | ..................... | H04M 1/02 |
| 2021/0361175 A1* | 11/2021 | Garcia Molina | .... | A61B 5/4836 |
| 2021/0367173 A1* | 11/2021 | Lee | ..................... | B32B 27/36 |

FOREIGN PATENT DOCUMENTS

| | | |
|---|---|---|
| CN | 107768413 A | 3/2018 |
| CN | 207134069 U | 3/2018 |

\* cited by examiner

FLEXIBLE SUBSTRATE, FLEXIBLE DISPLAY PANEL, AND MANUFACTURING METHOD THEREOF

BACKGROUND OF DISCLOSURE

1. Field of Disclosure

The present invention relates to the field of display technology, and more particularly, to a flexible substrate, a flexible display panel, and a manufacturing method thereof.

2. Description of Related Art

In recent years, there has been an increasing interest in full screen display devices. To organic light-emitting diode (OLED) display panels, pad bending technology can realize full screen effects through bending a bonding area of a flexible substrate in which a control chip is bonded to be behind a display panel.

While the bonding area is bent toward the back of the display panel, a bending area appears between the bonding area and a display area. Because a plurality of metal signal lines for transmitting signals are disposed between the bonding area and the display area, when the display panel is bent, the metal signal lines in the bending area break easily due to stresses, causing bad signal transmission so that the display panel can not display normally.

Therefore, it is necessary to provide a flexible substrate, a flexible display panel, and a manufacturing method to solve the above problems.

SUMMARY

A technical problem is that, when a display panel is bent, metal signal lines in a bending area break easily due to stresses, causing bad signal transmission so that the display panel can not display normally.

The object of the present disclosure is to provide a flexible substrate, a flexible display panel, and a manufacturing method, which can avoid that metal signal lines break due to stresses and ensure that a display panel can display normally.

In order to realize the above object, the present disclosure provides a flexible substrate having a bending area, the flexible substrate comprising: a first organic layer having a hollow-out portion in the bending area; an inorganic layer formed above the first organic layer, wherein the inorganic layer has a concave portion and a convex portion which are located in the bending area, wherein the concave portion is disposed on a surface of the inorganic layer, near the first organic layer, and wherein the convex portion is disposed on a surface of the inorganic layer, far from the first organic layer; and a second organic layer formed above the inorganic layer, wherein the second organic layer has an embedded portion in the bending area, and wherein the embedded portion and the convex portion of the inorganic layer are embedded with each other.

In some embodiments, material composition of the first organic layer comprises polyimide.

In some embodiments, material composition of the inorganic layer comprises SiNx.

In some embodiments, material composition of the second organic layer comprises polyimide.

In order to realize the above object, the present disclosure provides a flexible display panel, comprising a flexible substrate, and a thin-film transistor layer, an organic light-emitting diode layer, and an encapsulation layer which overlap above the flexible substrate, wherein the flexible substrate comprises: a first organic layer having a hollow-out portion in a bending area; an inorganic layer formed above the first organic layer, wherein the inorganic layer has a concave portion and a convex portion which are located in the bending area, wherein the concave portion is disposed on a surface of the inorganic layer, near the first organic layer, and wherein the convex portion is disposed on a surface of the inorganic layer, far from the first organic layer; and a second organic layer formed above the inorganic layer, wherein the second organic layer has an embedded portion in the bending area, and wherein the embedded portion and the convex portion of the inorganic layer are embedded with each other.

In order to realize the above object, the present disclosure provides a method of manufacturing a flexible display panel, comprising: forming a first organic layer on a substrate; determining a bending area on the first organic layer and forming an adhesion layer on a part of the first organic layer, located in the bending area; forming an inorganic layer on the adhesion layer and on the first organic layer; forming a second organic layer on the inorganic layer; forming a thin-film transistor layer, an organic light-emitting diode layer, and an encapsulation layer on the second organic layer in sequence; removing the substrate; and removing the part of the first organic layer, located in the bending area, and the adhesion layer so that the flexible display panel is formed.

In some embodiments, the steps of forming a first organic layer and a second organic layer comprise: forming the first organic layer and the second organic layer through a coating and curing method.

In some embodiments, the step of forming an adhesion layer on a part of the first organic layer, located in the bending area, comprises: forming the adhesion layer through a coating method.

In some embodiments, the step of forming an inorganic layer on the adhesion layer and on the first organic layer comprises: forming the inorganic layer through a chemical vapor deposition method.

In some embodiments, the step of removing the part of the first organic layer, located in the bending area, comprises: cutting the first organic layer through a laser.

In some embodiments, the adhesion layer comprises at least one material selected from a group consisting of hexamethyldisilazane (HMDS), sorbitol, and dimethyl sulfoxide (DMSO).

The beneficial effect of the present disclosure is that, a flexible substrate, a flexible display panel, and a manufacturing method are provided to avoid that metal signal lines break due to stresses and to ensure that a display panel can display normally.

BRIEF DESCRIPTION OF DRAWINGS

To ensure the features and the technical content of the disclosure are more apparent and easier to understand, please refer to the explanation and the accompanying drawings of the disclosure as follows. However, the accompanying drawings are merely for reference without limiting the disclosure.

DETAILED DESCRIPTION OF EMBODIMENTS

To ensure the objects, the technical solutions, and the effects of the disclosure are clearer and more specific, the disclosure will be explained in conjunction with the accompanying drawings in detail further below. It should be understood that the embodiments described herein are merely a part of the embodiments of the present disclosure instead of all of the embodiments and not used to limit the disclosure.

Figure 1:
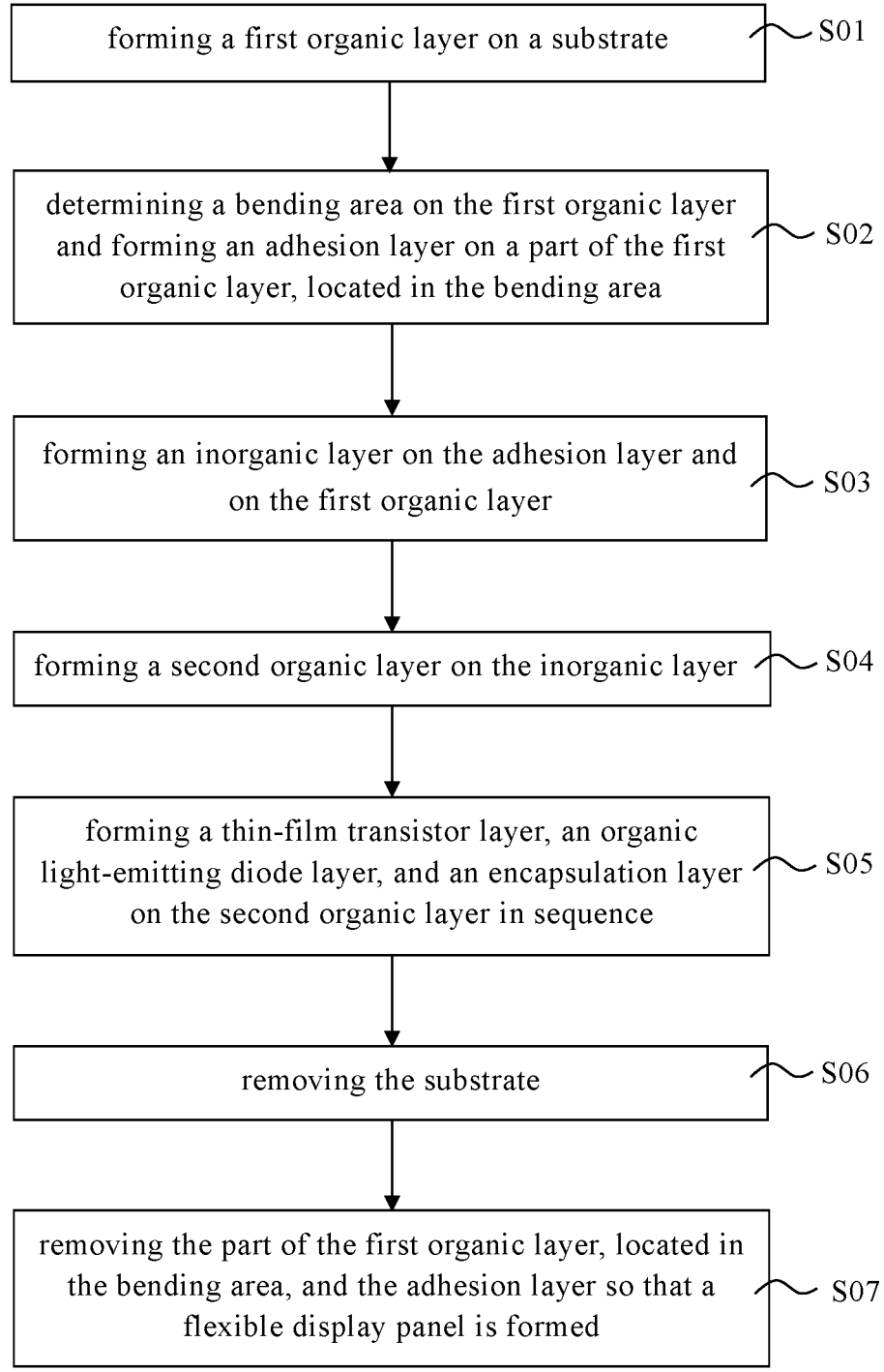
FIG. 1 is a flow chart illustrating a method of manufacturing a flexible display panel according to an embodiment of the present disclosure.
Figure 2A:
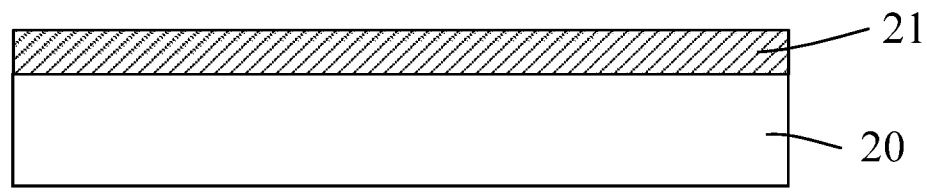
FIGS. 2A-2G are cross-sectional views corresponding to steps S01-S07 applied in FIG. 1.

Please refer to FIG. 1, which is a flow chart illustrating a method of manufacturing a flexible display panel according to an embodiment of the present disclosure. Please also refer to FIGS. 2A-2G, which are cross-sectional views corresponding to steps S01-S07 applied in FIG. 1. In FIG. 1, a method of manufacturing the flexible display panel comprises the following steps:

Step S01: forming a first organic layer 21 on a substrate 20 (as shown in FIG. 2A). In some embodiments, the first organic layer 21 is formed through a coating and curing method in step SOL Specifically, the substrate 20 is a glass substrate. Material composition of the first organic layer 21 comprises polyimide. The thickness of the first organic layer 21 is 5 to 15 micrometers.

Figure 2B:
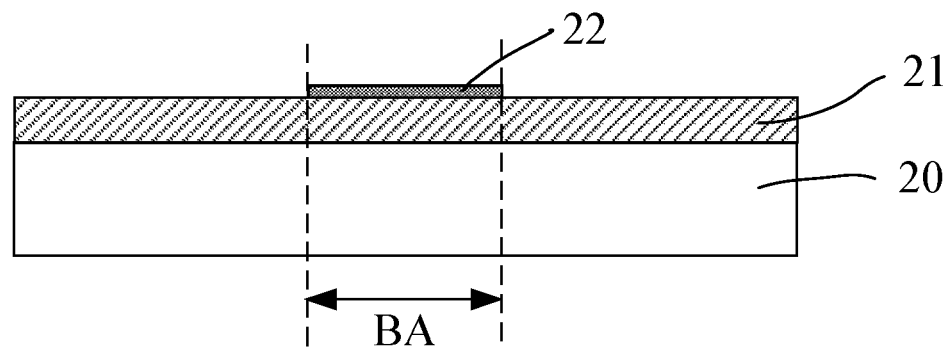

Step S02: determining a bending area BA on the first organic layer 21 and forming an adhesion layer 22 on a part of the first organic layer 21, located in the bending area BA (as shown in FIG. 2B). In some embodiments, the adhesion layer 22 is formed through a coating method in step S02. Specifically, the adhesion layer 22 comprises at least one material selected from a group consisting of hexamethyldisilazane (HMDS), sorbitol, and dimethyl sulfoxide (DMSO). The thickness of the adhesion layer 22 is 0.01 to 1 micrometer.

Figure 2C:
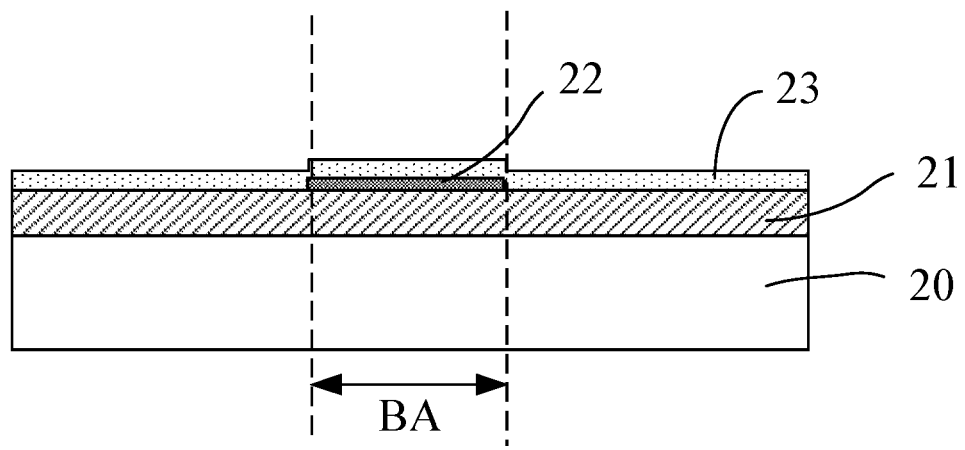

Step S03: forming an inorganic layer 23 on the adhesion layer 22 and on the first organic layer 21 (as shown in FIG. 2C). In some embodiments, the inorganic layer 23 is formed through a chemical vapor deposition method in step S03. Specifically, material composition of the inorganic layer 23 comprises SiNx. The thickness of the inorganic layer 23 is 0.1 to 1 micrometer.

Figure 2D:
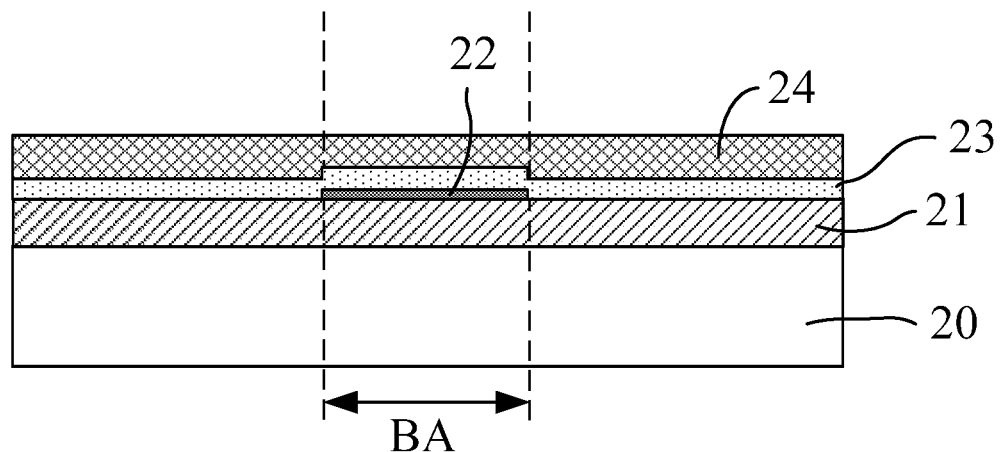

Step S04: forming a second organic layer 24 on the inorganic layer 23 (as shown in FIG. 2D). In some embodiments, the second organic layer 24 is formed through a coating and curing method in step S04. Specifically, material composition of the second organic layer 24 comprises polyimide. The thickness of the second organic layer 21 is 5 to 15 micrometers.

Figure 2E:
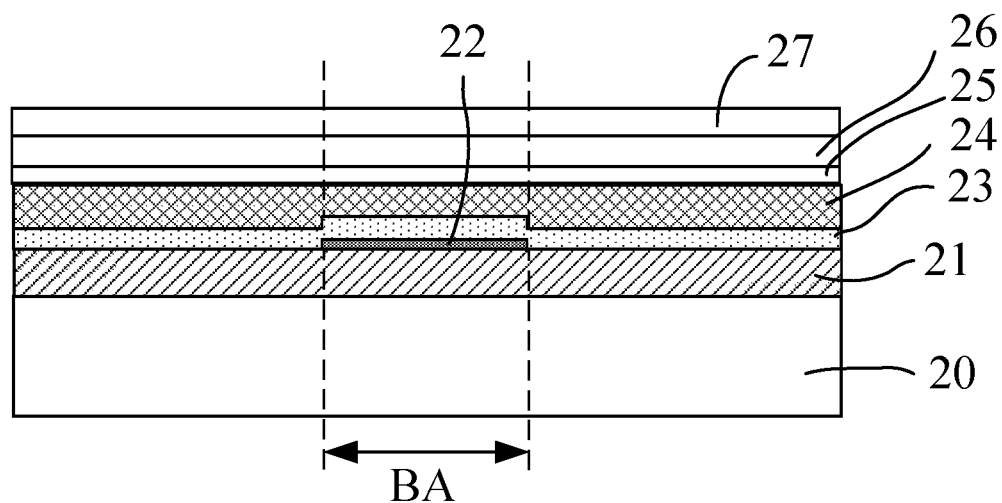

Step S05: forming a thin-film transistor layer 25, an organic light-emitting diode layer 26, and an encapsulation layer 27 on the second organic layer 24 in sequence (as shown in FIG. 2E).

Figure 2F:
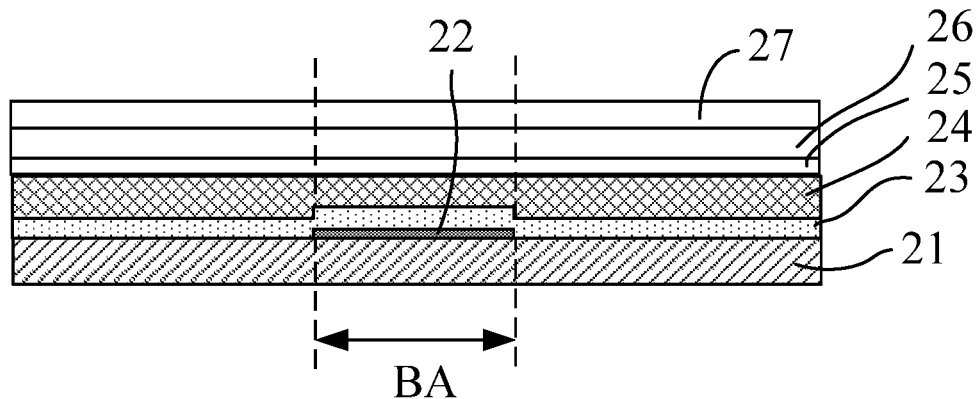

Step S06: removing the substrate 20 (as shown in FIG. 2F). In some embodiments, the substrate 20 is stripped through a laser in step S06.

Figure 2G:
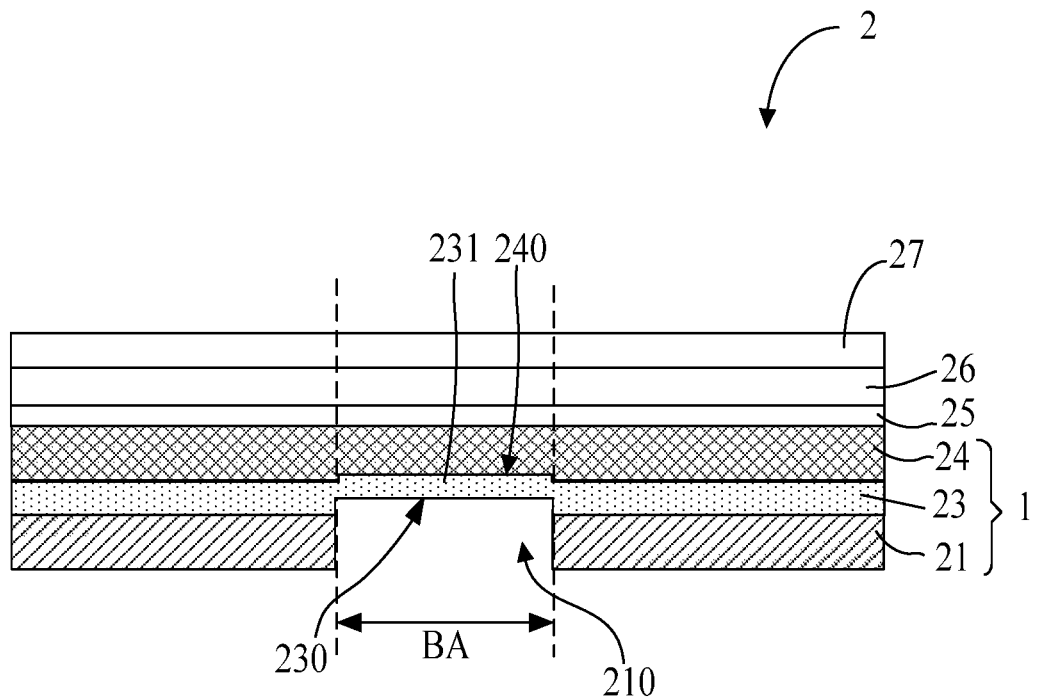

Step S07: removing the part of the first organic layer 21, located in the bending area BA, and the adhesion layer 22 so that a flexible display panel 2 is formed (as shown in FIG. 2G). In some embodiments, the first organic layer 21 is cut through a laser in step S07 in order to remove the part of the first organic layer 21, located in the bending area BA. Furthermore, the adhesion layer 22 peels off due to high temperatures.

Continuing to refer to FIG. 2G, the present disclosure provides a flexible substrate 1 having the bending area BA. The flexible substrate 1 comprises the first organic layer 21, the inorganic layer 23, and the second organic layer 24. The first organic layer 21 has a hollow-out portion 210 in the bending area BA. The inorganic layer 23 is formed above the first organic layer 21, and it has a concave portion 230 and a convex portion 231 which are located in the bending area BA. The concave portion 230 is disposed on a surface of the inorganic layer 23, near the first organic layer 21, and the convex portion 231 is disposed on a surface of the inorganic layer 23, far from the first organic layer 21. The second organic layer 24 is formed above the inorganic layer 23, and it has an embedded portion 240 in the bending area BA. The convex portion 231 of the inorganic layer 23 and the embedded portion 240 are embedded with each other. Furthermore, as shown in FIG. 2G, the flexible display panel 2 provided in the present disclosure comprises the flexible substrate 1, and the thin-film transistor layer 25, the organic light-emitting diode layer 26, and the encapsulation layer 27 which overlap above the flexible substrate 1.

In conclusion, the present disclosure provides a flexible substrate, a flexible display panel, and a manufacturing method mainly by thinning a thickness of a flexible substrate with multilayered structure in order to avoid that metal signal lines in a bending area break due to stresses and to ensure that the display panel can display normally.

It should be understood that the application of the present disclosure is not limited by the foregoing examples. A person of ordinary skill in the art is able to make modifications or changes based on the foregoing description, and all of these modifications and changes are within the scope of the appended claims of the present disclosure.

The industrial applicability of the present disclosure is that, it can avoid that metal signal lines in a bending area break due to stresses and ensure that a display panel can display normally.

What is claimed is:

1. A flexible substrate having a bending area, the flexible substrate comprising:
    a first organic layer having a hollow-out portion in the bending area;
    an inorganic layer formed above the first organic layer, wherein the inorganic layer has a concave portion and a convex portion which are located in the bending area, wherein the concave portion is disposed on a surface of the inorganic layer, near the first organic layer, and wherein the convex portion is disposed on a surface of the inorganic layer, far from the first organic layer; and
    a second organic layer formed above the inorganic layer, wherein the second organic layer has an embedded portion in the bending area, and wherein the embedded portion and the convex portion of the inorganic layer are embedded with each other.

2. The flexible substrate of claim 1, wherein material composition of the first organic layer comprises polyimide.

3. The flexible substrate of claim 1, wherein material composition of the inorganic layer comprises SiNx.

4. The flexible substrate of claim 1, wherein material composition of the second organic layer comprises polyimide.

5. A flexible display panel, comprising a flexible substrate, and a thin-film transistor layer, an organic light-emitting diode layer, and an encapsulation layer which overlap above the flexible substrate, wherein the flexible substrate comprises:
    a first organic layer having a hollow-out portion in a bending area;
    an inorganic layer formed above the first organic layer, wherein the inorganic layer has a concave portion and a convex portion which are located in the bending area, wherein the concave portion is disposed on a surface of the inorganic layer, near the first organic layer, and wherein the convex portion is disposed on a surface of the inorganic layer, far from the first organic layer; and a second organic layer formed above the inorganic layer, wherein the second organic layer has an embedded portion in the bending area, and wherein the embedded portion and the convex portion of the inorganic layer are embedded with each other.

6. A method of manufacturing a flexible display panel, comprising:

forming a first organic layer on a substrate;

determining a bending area on the first organic layer and forming an adhesion layer on a part of the first organic layer, located in the bending area;

forming an inorganic layer on the adhesion layer and on the first organic layer;

forming a second organic layer on the inorganic layer;

forming a thin-film transistor layer, an organic light-emitting diode layer, and an encapsulation layer on the second organic layer in sequence;

removing the substrate; and removing the part of the first organic layer, located in the bending area, and the adhesion layer so that the flexible display panel is formed.

7. The method of claim 6, wherein the step of forming the adhesion layer on the part of the first organic layer, located in the bending area, comprises: forming the adhesion layer through a coating method.

8. The method of claim 6, wherein the step of forming the inorganic layer on the adhesion layer and on the first organic layer comprises: forming the inorganic layer through a chemical vapor deposition method.

9. The method of claim 6, wherein the step of removing the part of the first organic layer, located in the bending area, comprises: cutting the first organic layer through a laser.

10. The method of claim 6, wherein the adhesion layer comprises at least one material selected from the group consisting of hexamethyldisilazane (HMDS), sorbitol, and dimethyl sulfoxide (DMSO).

* * * * *